US012421420B2

(12) United States Patent
Liu et al.

(10) Patent No.: US 12,421,420 B2
(45) Date of Patent: Sep. 23, 2025

(54) SOLAR RECEIVER, SELECTIVELY ABSORBING MATERIAL, AND ASSOCIATED FABRICATION METHODS

(71) Applicant: The Trustees of Dartmouth College, Hanover, NH (US)

(72) Inventors: Jifeng Liu, Hanover, NH (US); Xiaoxin Wang, Hanover, NH (US); Eldred Lee, Hanover, NH (US); Can Xu, Lebanon, NH (US)

(73) Assignee: The Trustees of Dartmouth College, Hanover, NH (US)

( * ) Notice: Subject to any disclaimer, the term of this patent is extended or adjusted under 35 U.S.C. 154(b) by 725 days.

(21) Appl. No.: 17/176,519

(22) Filed: Feb. 16, 2021

(65) Prior Publication Data

US 2021/0348023 A1 Nov. 11, 2021

Related U.S. Application Data

(63) Continuation-in-part of application No. PCT/US2019/046870, filed on Aug. 16, 2019.
(Continued)

(51) Int. Cl.
*C09D 183/04* (2006.01)
*B05D 1/02* (2006.01)
(Continued)

(52) U.S. Cl.
CPC ............ *C09D 183/04* (2013.01); *B05D 1/02* (2013.01); *C09D 5/32* (2013.01); *C09D 7/61* (2018.01);
(Continued)

(58) Field of Classification Search
CPC ... H01L 31/00; H01L 31/024; H01L 31/0463; H01L 31/054; C09D 183/04; C09D 7/61;
(Continued)

(56) References Cited

U.S. PATENT DOCUMENTS 6,492,271 B1  12/2002  Uozumi et al.
8,021,778 B2   9/2011  Snyder et al.
(Continued)

FOREIGN PATENT DOCUMENTS

CA         1187638 A  *  5/1985  ............... C09D 5/32
WO    WO 2015/138990 A1    9/2015
(Continued)

OTHER PUBLICATIONS

International Patent Application No. PCT/US2022/016605 International Search Report and Written Opinion dated Jun. 29, 2022, 9 pages.
(Continued)

*Primary Examiner* — Mayla Gonzalez Ramos
(74) *Attorney, Agent, or Firm* — Cozen O'Connor (57) ABSTRACT

A selectively-absorbing material includes a silicone polymer and transition-metal oxide nanoparticles dispersed therein. Each of the transition-metal oxide nanoparticles includes manganese. A solar receiver includes (i) a metal substrate including an etched surface having a microroughness between 0.05 micrometers and two micrometers; (ii) a polymer matrix disposed on the etched surface; and (iii) transition-metal oxide nanoparticles dispersed within the polymer matrix. A method for producing transition-metal oxide nanoparticles includes recrystallizing a plurality of two-element nanoparticles at a temperature between 300 and 700° C. The plurality of two-element nanoparticles includes at least two of (i) copper oxide nanoparticles, (ii) manganese oxide nanoparticles, and (iii) iron oxide nanoparticles. A method for fabricating a selective-absorber includes etching a top surface of a metal substrate; depositing a polymer-matrix composite on the etched top surface; and interdiffusing the polymer-matrix composite and the metal substrate.
(Continued)

The polymer-matrix composite includes transition-metal oxide nanoparticles dispersed therein.

20 Claims, 9 Drawing Sheets

Related U.S. Application Data (60) Provisional application No. 62/719,577, filed on Aug. 17, 2018.

(51) Int. Cl.
| | |
|---|---|
| *B82B 3/00* | (2006.01) |
| *C08K 3/22* | (2006.01) |
| *C09D 5/32* | (2006.01) |
| *C09D 7/61* | (2018.01) |
| *H10F 77/42* | (2025.01) |
| *B82Y 20/00* | (2011.01) |

(52) U.S. Cl.
CPC ......... *H10F 77/42* (2025.01); *B05D 2202/15* (2013.01); *B05D 2202/40* (2013.01); *B05D 2350/35* (2013.01); *B05D 2518/12* (2013.01); *B82B 3/0014* (2013.01); *B82B 3/0023* (2013.01); *B82Y 20/00* (2013.01); *C08K 2003/2248* (2013.01); *C08K 2003/2262* (2013.01); *C08K 2003/2265* (2013.01); *C08K 2201/011* (2013.01)

(58) Field of Classification Search
CPC ........ C09D 5/32; B05D 1/02; B05D 2202/15; B05D 2202/40; B05D 2350/35; B05D 2518/12; B82B 3/0014; B82B 3/0023; B82Y 20/00; B82Y 30/00; B82Y 40/00; C08K 2003/2265; C08K 2003/2262; C08K 2003/2248; C08K 2201/011; H10F 77/42
See application file for complete search history.

(56) References Cited

U.S. PATENT DOCUMENTS

| | | | | |
|---|---|---|---|---|
| 2010/0218819 | A1* | 9/2010 | Farmer | ............ H01L 31/02167 |
| | | | | 257/434 |
| 2015/0107582 | A1* | 4/2015 | Jin | ......................... G02B 5/208 |
| | | | | 428/206 |
| 2017/0073530 | A1* | 3/2017 | Jin | ..................... C01G 49/0072 |
| 2017/0361577 | A1 | 12/2017 | Anderson et al. | |
| 2018/0231705 | A1 | 8/2018 | Patrick et al. | |
| 2018/0299705 | A1* | 10/2018 | Schmidt | ............... H01L 33/507 |
| 2019/0341584 | A1 | 11/2019 | Schreiber et al. | |
| 2020/0216683 | A1 | 7/2020 | Zwicker | |

FOREIGN PATENT DOCUMENTS

| | | | |
|---|---|---|---|
| WO | WO 2017/019179 A1 | 2/2017 | |
| WO | WO 2020/037235 A1 | 2/2020 | |

OTHER PUBLICATIONS

International Patent Application No. PCT/US2019/046870 International Search Report and Written Opinion dated Oct. 28, 2019, 12 pages.

Clifford K. Ho et al., "Characterization of Pyromark 2500 Paint for High-Temperature Solar Receivers", Journal of Solar Energy—Transactions of ASME, vol. 136, 14502, Feb. 2014, 4 pages.

Andrea Ambrosini, "High-Temperature Solar Selective Coating Development for Power Tower Receivers", Sandia National Labs, CSP Program Summit, 2016, 26 pages.

Andrea Ambrosini et al., "Thermal Stability of Oxide-Based Solar Selective Coatings for CSP Central Receivers", Proceedings of the ASME 2015 9th International Conference on Energy Sustainability, 2015, 10 pages.

E. Sani, et al., "Ultra-High Temperature Ceramics for solar receivers: spectral and high-temperature emittance characterization", Journal of the European Optical Society—Rapid Publication 7, 12052, Dec. 16, 2012, 5 pages.

Clifford K. Ho et al., "Highlights of the high-temperature falling particle receiver project: 2012-2016", AIP Conference Proceedings 1850, 030027, 2017, 9 pages.

Jaeyun Moon et al., "Black Oxide Nanoparticles As Durable Solar Absorbing Material For High-Temperature Concentrating Solar Power System", Solar Energy Materials and Solar Cells, vol. 134, Mar. 2015, 24 pages.

A. Morales, "Selective Absorbers", Optical Coatings Technology Lab. Unit of Solar Concentrating Systems Plataforma Solar de Almería PSA CIEMAT, 50 pages.

\* cited by examiner

FIG. 16

SOLAR RECEIVER, SELECTIVELY ABSORBING MATERIAL, AND ASSOCIATED FABRICATION METHODS

CROSS-REFERENCE TO RELATED APPLICATIONS

This application is a continuation in part of International Patent Application No. PCT/US19/46870 filed on Aug. 16, 2019, which claims priority to U.S. Provisional Application No. 62/719,577, filed on Aug. 17, 2018. The disclosure of each of these applications is incorporated herein by reference in its entirety.

GOVERNMENT RIGHTS

This invention was made with government support under grant Nos. DE-EE0007112 and DE-EE0008530 awarded by the United States Department of Energy. The government has certain rights in the invention.

BACKGROUND

Concentrated solar power (CSP) systems complement photovoltaic (PV) technology via energy storage to better integrate solar electricity into power grids. A method for improving efficiency of CSP systems is to increase optical absorption in the solar spectrum regime while decreasing emissivity in the infrared (IR) spectrum, which enables attainment of higher operating temperatures. Increased operating temperatures improves power-cycle efficiency and hence lowers cost of lower levelized cost of the produced solar energy.

SUMMARY OF THE EMBODIMENTS

PV technology for solar electricity is in high demand but lacks the flexibility on low-cost energy storage of electricity. CSP, by contrast, concentrates incident solar optical energy to heat working fluids that drive heat engines for electricity generation. The heated working fluid can be stored at low cost for more than ten hours, supplying solar electricity in non-sunny conditions. Therefore, CSP systems may complement the PV technology for low-cost energy storage. The efficiency of current CSP systems can improve with (a) high absorption in the ultraviolet (UV), visible (VIS), and near-infrared (NIR) regime (solar spectrum wavelength regime; $\lambda=0.2$ μm-2 μm) and (b) low emissivity in the infrared (IR) regime (IR wavelength regime; $\lambda=2.5$ μm-18 μm). This functionality is implemented by solar selective-absorber coatings on the surface of metal tubes that transport the working fluid. The term "solar selective" means that the coating selectively absorbs solar radiation with minimal IR radiation.

Higher operating temperatures increase power-cycle efficiency in CSP systems according to Carnot's Theorem. Currently, the target is achieving an operation temperature of 750° C. However, a critical challenge is the lack of solar selective-absorbers that demonstrate both high thermal efficiency ($\eta_{therm}$>90 percent) and long-term thermal stability at temperatures exceeding 700° C. in air. State-of-the-art non-spectrally-selective Pyromark® 2500 coatings need multi-step heat treatment to get better adhesion. They have significantly high solar absorptance (>95 percent) in the solar spectrum regime but also have considerable emissivity loss (~87 percent) in the IR spectrum. Therefore, the $\eta_{therm}$ is typically limited to ≤89.5 percent for 1000× solar concentration after annealing in air at 700° C. for 480 hours. When operating at 750° C., the solar absorptance of Pyromark® decreases significantly in 300 h due to phase transitions of pigments, and $\eta_{therm}$ further decreases to ~88 percent. While ceramic receivers can address the high-temperature stability issue at low cost, the maximal solar absorptance of ~80 percent (using SiC) limits the $\eta_{therm}$ to <80 percent. Various oxide solar absorbers have been investigated in recent years and some of them demonstrate good thermal stability at 750° C., yet the lack of spectral selectivity limits their $\eta_{therm}$ to less than 90 percent at temperatures exceeding 700° C. Some multi-layer coatings, incorporating a platinum infrared (IR) reflector layer and two diffusion barrier layers, are thermally stable up to 500° C. and show a high $\eta_{therm}$~93.6 percent for solar concentration ratio C=1000 due to the excellent solar spectral selectivity. However, the coating cannot survive at 650° C. in air, where the platinum IR reflector layer degrades dramatically.

Low-cost Ni nanochain-$SiO_x$ (x<2; Ni radius: 10-40 nm) coatings demonstrate thermodynamic antioxidation behavior at 680° C. Yet, once they are deposited on metal substrates, the oxidation of the metal as well as the interdiffusion between the coatings and the substrates can deteriorate the optical responses of the coatings. Therefore, it is highly desirable to overcome the limits of state-of-the-art solar absorbers and simultaneously achieve $\eta_{therm}$>90 percent and high thermal stability at 750° C. for future CSP systems.

Embodiments disclosed herein address challenges and complexities caused by metal oxidation at high temperatures that interfere with creating low-cost solar selective-absorbers for high-temperature, air-stable applications. These embodiments include oxide-polymer composite solar selective coatings whose performance is enhanced rather than deteriorated upon aging at high temperatures. In this case, interdiffusion with the substrates is engineered to improve the stoichiometry in the oxide nanoparticle pigments, thereby overcoming efficiency droop in high temperature operation.

Embodiments disclosed herein include a low-cost, thermodynamically-stable, high-temperature oxide-polymer composite solar selective-absorber for concentrated solar power (CSP) systems operating at >650° C. An example of the oxide-polymer composite solar selective-absorber comprises stoichiometric and non-stoichiometric transition metal oxide nanoparticles dispersed in silicone precursors that undergo interdiffusion reaction with Ni-based alloy substrates and stainless steel-like alloys. Advantageously, the optical-to-thermal conversion efficiency ($\eta_{therm}$) initially increases and then stabilizes with aging time, overcoming the long-standing problem of efficiency droop in state-of-the-art (SOA) solar selective-absorber coatings. These solar selective-absorbers may be applied to CSP systems to complement photovoltaic (PV) technology and address the intermittency issue of solar energy, while increasing energy output, by offering low-cost solar thermal energy storage.

In a first aspect a selectively-absorbing material includes a silicone polymer and a plurality of transition-metal oxide nanoparticles dispersed within the silicone polymer. Each of the plurality of transition-metal oxide nanoparticles includes manganese.

In a second aspect, a solar receiver includes a metal substrate including an etched surface having a root-mean-square microroughness between 0.05 micrometers and two micrometers; a polymer matrix disposed on the etched surface; and a plurality of transition-metal oxide nanoparticles dispersed within the polymer matrix.

In a third aspect, a method producing a plurality of transition-metal oxide nanoparticles includes recrystallizing a plurality of two-element nanoparticles at a temperature between 300 and 700° C. The plurality of two-element nanoparticles includes at least two of (i) copper oxide nanoparticles, (ii) manganese oxide nanoparticles, and (iii) iron oxide nanoparticles.

In a fourth aspect, a method for fabricating a selective-absorber includes etching a top surface of a metal substrate; depositing a polymer-matrix composite on the etched top surface; and interdiffusing the polymer-matrix composite and the metal substrate. The polymer-matrix composite includes a plurality of transition-metal oxide nanoparticles dispersed therein

DETAILED DESCRIPTION OF THE EMBODIMENTS

Figure 1:
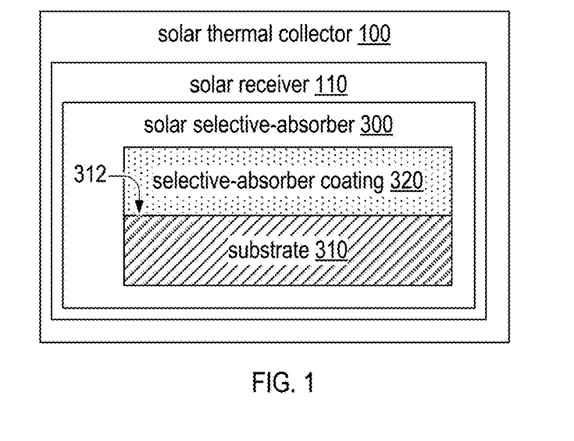
FIG. 1 is a schematic of a solar selective-absorber of a solar receiver configured within a solar thermal collector, in an embodiment.

FIG. 1 is a schematic of a solar thermal collector 100 that includes a solar receiver 110. Solar receiver 110 includes a solar selective-absorber 300, which includes a substrate 310 with a selective-absorber coating 320 thereon. Substrate 310 has an etched surface 312. Selective-absorber coating 320 is formed on substrate 310 by depositing a selectively-absorbing material 200 on etched surface 312. Examples of solar thermal collector 100 include parabolic troughs and solar power towers. Examples of solar receiver 110 include flat-plate collectors and tube collectors. As such, etched surface 312 may be non-planar, for example, by having a radius of curvature corresponding to a radius of a tube collector. In embodiments, this radius is between ten millimeters and fifty millimeters.

Figure 2:
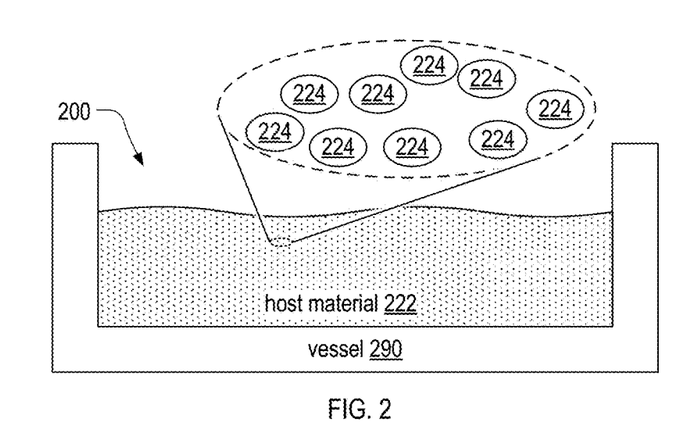
FIG. 2 is a schematic of a vessel storing a selectively-absorbing material used to form the solar selective-absorber of FIG. 1, before deposition on the substrate.

FIG. 2 is a schematic of a vessel 290 storing a selectively-absorbing material 200, before its deposition on substrate 310. Selectively-absorbing material 200 includes a host material 222 and a plurality of transition-metal oxide nanoparticles 224 dispersed therein. In embodiments, host material 222 is a polymer such as silicone, and may have a kinematic viscosity between 0.3 and 500 square-millimeters per second. Optimal viscosity is a trade-off between faster fabrication (via accelerated drying time) at low viscosities, and better optical properties at high viscosities. Per the International Organization for Standardization's Technical Specification (ISO/TS) 80004-2:2015, a particle having all external dimensions between one nanometer and one hundred nanometers qualifies as a nanoparticle.

Examples of host material 222 include silicone fluids (polydimethylsiloxane, trimethylsiloxy terminated) DMS-T00 (T00) and DMS-T15 (T15) with kinematic viscosities of 0.65 mm$^2$/s (T00) and 50 mm$^2$/s (T15), respectively (Gelest, Inc., Morrisville Pa.). A high-molecular weight silicone resin, such as Xiameter RSN-0805 with kinematic viscosities of 250 mm$^2$/s ("RSN," Corning, Corning N.Y.), is also a candidate for host material 222.

Figure 3:
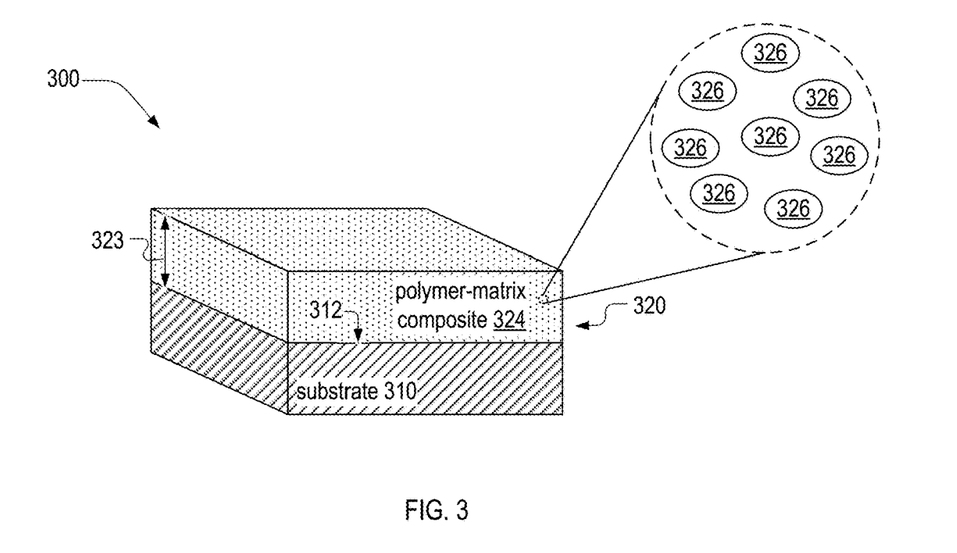
FIG. 3 is a schematic cross-sectional view of the solar selective-absorber of FIG. 1, in an embodiment.

In embodiments, selectively-absorbing material 200 has at least one of the following properties: (a) all external dimensions each of the plurality of nanoparticles 224 are between six nanometers and sixty nanometers; (b) a volume fraction of nanoparticles 224 within polymer-matrix composite 324 is between 0.1 and ten percent; (c) a weight fraction of nanoparticles 224 within polymer-matrix composite 324 is between 0.1 percent and ten percent; and (d) each of the plurality of nanoparticles 224 has a cubic spinel crystal structure. Each of these properties increase coating 320's optical-to-thermal energy conversion efficiency. A cubic spinel crystal structure has an additional benefit of being a stable lattice structure at >700° C.

Nanoparticles 224 may include non-stoichiometric metal oxide nanoparticles, which facilitates further optimization of the optical properties of polymer-matrix composite 324 by enabling increased inclusion of elements from substrate 310, Cu, Mn, and Fe for example, in polymer-matrix composite 324. When nanoparticles 224 include non-stoichiometric metal oxide nanoparticles, a cubic spinel crystal structure enables such nanoparticles to transform into phases that further enhance optical performance of selective-absorber coating 320.

In embodiments, nanoparticles 224 include a plurality of $MnFe_2O_4$ nanoparticles, and may also include a plurality of non-stoichiometric $Mn_{1-x}Fe_{2+y}O_4$ nanoparticles. The $MnFe_2O_4$ nanoparticles may have a mean diameter of 28±2 nm and have a composition purity exceeding 98 percent. To achieve sufficient optical-to-thermal energy conversion efficiency, values of x and y may satisfy −0.3<x<0.3 and −0.3<y<0.3. In embodiments, nanoparticles 224 include a plurality of $Cu_yFe_xMn_{2-x}O_4$ nanoparticles and/or $Cu_yCr_xMn_{2-x}O_4$ nanoparticles. In embodiments, x and y satisfy the following conditions to achieve sufficient optical-to-thermal energy conversion efficiency: 0.05≤x≤1.0 and 0.5≤y≤1.5. In embodiments, x and y are further tuned such that Mn:Fe≥3 and Cu:(Mn+Fe)≤2, which results in slightly higher optical-to-thermal energy conversion efficiency.

In embodiments, nanoparticles 224 include a plurality $MnO_2$ nanoparticles, which may have a composition purity of 98 percent and a mean diameter of 50±3 nm. In embodiments, nanoparticles 224 include a plurality of least one of the following oxide nanoparticles: NiO (composition purity: 99 percent, diameter: 10-20 nm), $CuFe_2O_4$ (purity: 99.9 percent, mean diameter: 30±2 nm), $Mn_2O_3$ (composition purity: 99.2 percent, mean diameter: 30±2 nm), where the purity and diameter values are provided by way of example only.

FIG. 3 is a schematic cross-sectional view of solar selective-absorber 300 introduced in FIG. 1. Solar-selective coating 320 includes a polymer-matrix composite 324 and, dispersed therein, a plurality of transition-metal oxide nanoparticles 326. Substrate 310 includes etched surface 312 upon which coating 320 is disposed. In embodiments, substrate 310 is formed of a nickel-based alloy, stainless steel, or a combination thereof. The nickel-based alloy may be an austenitic nickel-chromium-based superalloy, such as an Inconel alloy.

In embodiments, substrate 310 includes one or more transition elements, such as chromium, manganese, iron, and/or copper. Upon interdiffusion between coating 320 and substrate 310, transition metal elements inside substrate 310 diffuse into nanoparticles 224, which results in nanoparticles 326. Such interdiffusion further optimizes their stoichiometry and enhances optical performance of coating 320.

In embodiments, etched surface 312 has a root-mean-square microroughness between 0.05 micrometers and two micrometers. Advantages of said microroughness include increased solar-spectrum absorption, decreased infrared emittance, improved adhesion of coating 320 to substrate 310, and improved interdiffusion between coating 320.

For example, solar selective-absorber coatings with $MnFe_2O_4$ and $MnO_2$ nanoparticles and the complete matrix were deposited onto substrate 310 using methods disclosed herein. These samples, with surface etchings, were thermally annealed with air at 750° C. for 500 hours. Prior to thermal air annealing with said criteria, the maximum solar absorptance ranges from 93% to 95% and the maximum IR emittance is 95%. After annealing, the results demonstrate that absorptance can exceed 97% in the solar spectrum regime. Post-annealing emittance values in the IR spectral band range from approximately forty-five to eighty percent.

Polymer-matrix composite 324 may be formed of silicone and has a thickness 323. In embodiments, thickness 323 is between one micrometer and fifty micrometers. When polymer-matrix composite 324 is too thin, thinner than one micrometer for example, a larger volume fraction (density) of nanoparticles 326 are required to achieve desired absorption properties. Fabrication of a coating 320 with such a large volume fraction of nanoparticles is relatively difficult, for example, in terms of nanoparticle dispersion within polymer-matrix composite 324. When polymer-matrix composite 324 is too thick, thicker than fifty micrometers for example, coating 320 incurs excess thermal stress and is susceptible to spalling upon thermal cycling.

Figure 4:
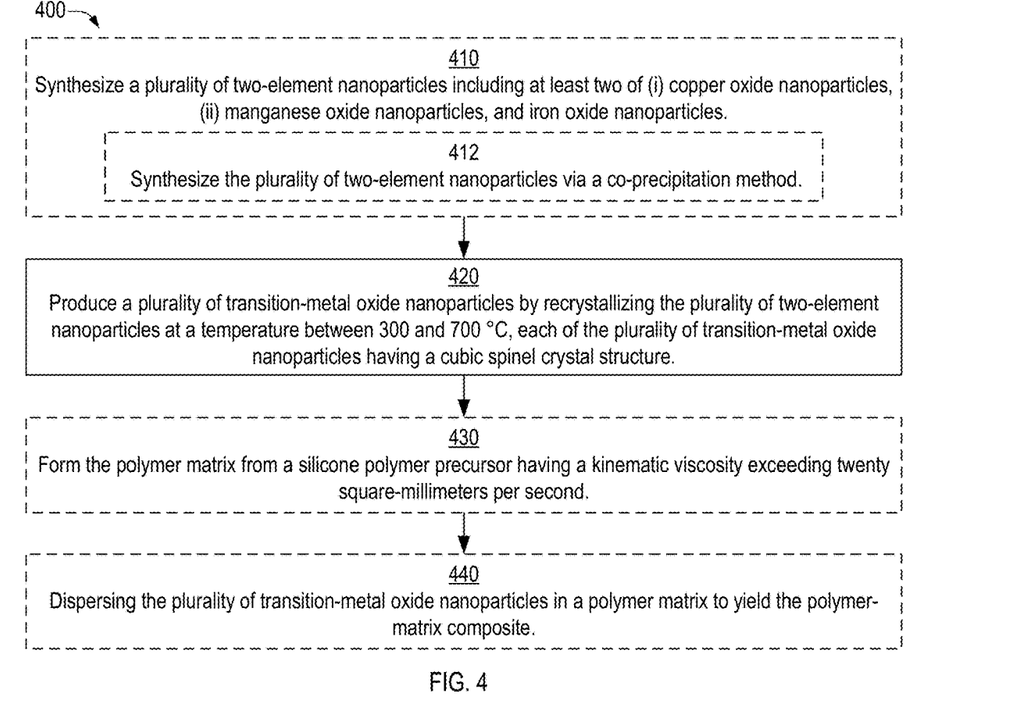
FIG. 4 is a flowchart illustrating a method for forming a polymer-matrix composite of the solar selective-absorber of FIG. 1, in an embodiment.

FIG. 4 is a flowchart illustrating a method 400 for forming a plurality of transition-metal oxide nanoparticles, such as selectively-absorbing material 200. Method 400 includes step 420 and may further include a step 410 preceding step 420. In embodiments, method 400 also includes at least one of steps 430, and 440, in which case method 400 is also a method for forming a polymer-matrix composite.

Step 410 includes synthesizing a plurality of two-element nanoparticles including at least two of (i) copper oxide nanoparticles, (ii) manganese oxide nanoparticles, and (iii) iron oxide nanoparticles. Step 410 may include step 412, which includes synthesizing the plurality of two-element nanoparticles via a co-precipitation process. In a first example of step 412, at least two of (i) copper oxide nanoparticles, (ii) manganese oxide nanoparticles, and (iii) iron oxide nanoparticles are synthesized via a respective co-precipitation process. In a second example of step 412, at least two of (i) copper oxide nanoparticles, (ii) manganese oxide nanoparticles, and (iii) iron oxide nanoparticles are synthesized together via a single co-precipitation process.

Step 420 includes producing a plurality of transition-metal oxide nanoparticles by recrystallizing the plurality of two-element nanoparticles at a temperature between 300° C. and 700° C. In embodiments, the resulting transition-metal oxide nanoparticles have a cubic spinel crystal structure. Inclusion of both step 412 and step 420 ensures that the plurality of transition-metal oxide nanoparticles have a cubic spinel crystal structure. In an example of step 420, transition-metal oxide nanoparticles 224 are produced by recrystallizing the plurality of two-element nanoparticles.

Step 430 includes forming the polymer matrix from a silicone polymer precursor having a kinematic viscosity between 0.5 and 500 square-millimeters per second. In an example of step 430, polymer-matrix composite 324 is formed from a host material 222 via either spray-coating or dip-coating.

Step 440 includes dispersing the plurality of transition-metal oxide nanoparticles in a polymer matrix to yield the polymer-matrix composite. In an example of step 440, transition-metal oxide nanoparticles 224 are dispersed, e.g., uniformly dispersed, in polymer-matrix composite 324.

Figure 5:
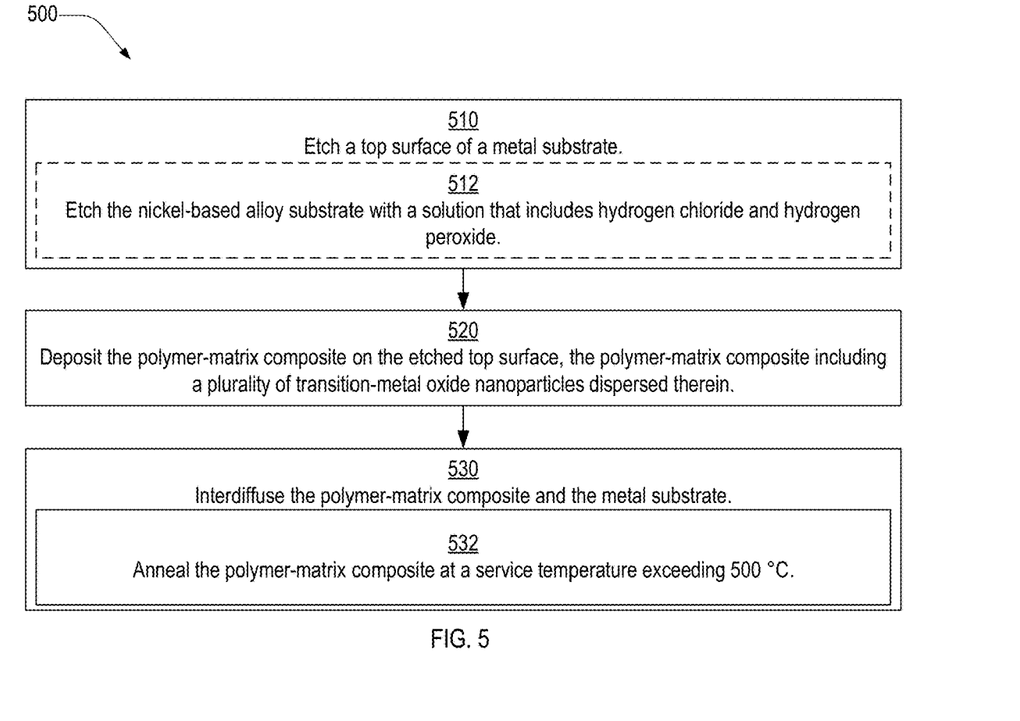
FIG. 5 is a flowchart illustrating a method for fabricating the selective-absorber of FIG. 1, in an embodiment.

FIG. 5 is a flowchart illustrating a method 500 for fabricating a selective-absorber, such as solar-selective absorber 300. Method 500 includes steps 510, 520, and 530.

Step 510 includes etching a top surface of a metal substrate. In an example of step 510, etched surface 312 of substrate 310 is etched. Candidate etching methods include chemical etching, mechanical etching, and plasma etching. Step 510 may include step 512, which includes etching the metal substrate with a solution that includes hydrogen chloride and hydrogen peroxide. In the solution, the ratio $HCl:H_2O_2$ may be between 1:1 and 1:10. The top surface may be etched for a duration up to one minute. In an example of step 512, substrate 310 is etched with a solution that includes hydrogen chloride and hydrogen peroxide.

Step 520 includes depositing a polymer-matrix composite on the etched top surface, the polymer-matrix composite including a plurality of transition-metal oxide nanoparticles dispersed therein. In an example of step 520, polymer-matrix composite 324 is deposited on etched surface 312. In step 520 the substrate may be heated, e.g., to 80° C. In embodiments, the transition-metal oxide nanoparticles dispersed in the polymer-matrix composite had previously been recrystallized, e.g., per step 420 of method 400.

Step 530 includes interdiffusing the polymer-matrix composite and the metal substrate. In an example of step 530, polymer-matrix composite 324 and substrate 310 are interdiffused. Step 530 may include step 532, which includes annealing the polymer-matrix composite at a service temperature exceeding 500° C. In embodiments, the service temperature exceeds 700° C. In embodiments, step 530 includes annealing the polymer-matrix composite for at least twenty-four hours. In embodiments where step 530 does not include step 532, the transition-metal oxide nanoparticles dispersed in the polymer-matrix composite may have been previously been recrystallized, e.g., per step 420 of method 400.

Figure 6:
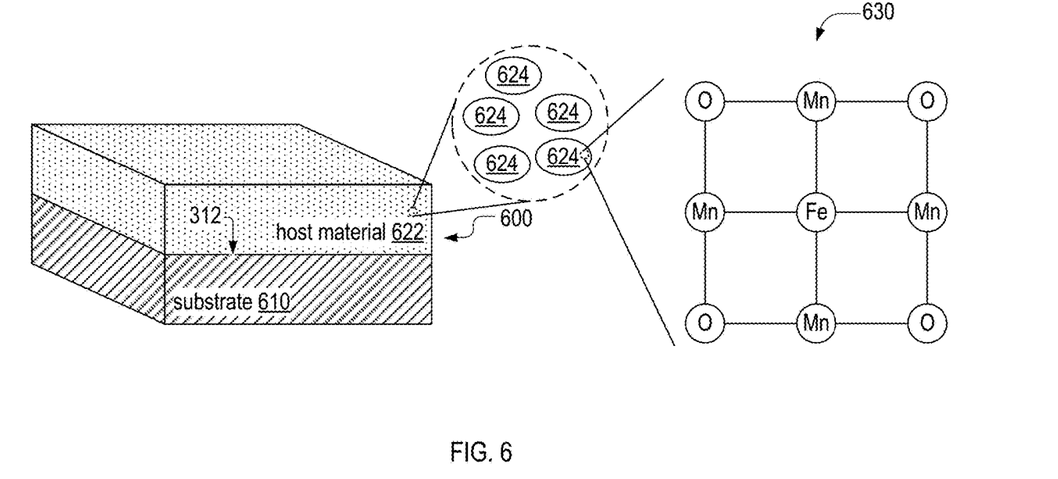
FIG. 6 is a schematic of an embodiment of the selectively-absorbing material of FIG. 2.

FIG. 6 is a schematic of a coating material 600 deposited on a metal substrate 610 prior to interdiffusion of respective ions of metal substrate 610 with coating material 600, for example between steps 520 and 530 of method 500. In embodiments, metal substrate 610 is either a nickel-based alloy or stainless steel, and may include a plurality of transition-metals, for example, at least one of chromium, carbon, phosphorus, nickel, silicon, and sulfur. Coating material 600 and metal substrate 610 are examples of selectively-absorbing material 200 and substrate 310, respectively. Coating material 600 includes a plurality of nanoparticles 624, which are an example of nanoparticles 224. Each nanoparticle 624 is formed of a crystal lattice, which has a spinel unit cell 630 formed of manganese, iron, and oxygen. Nanoparticles 624 are in a host material 622, which is an example of host material 222, FIG. 2.

Figure 7:
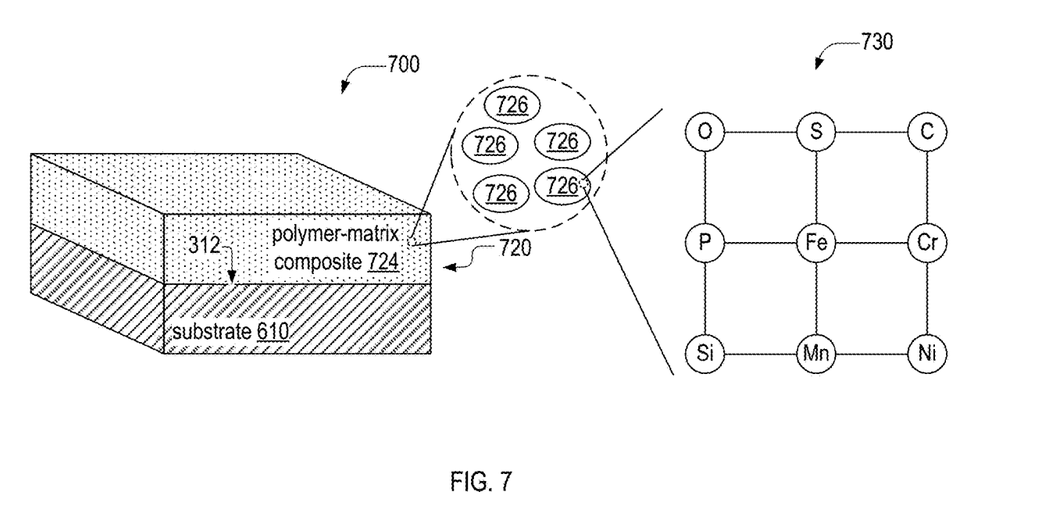
FIG. 7 is a schematic of an embodiment of the solar selective-absorber of FIG. 1, as implemented in an embodiment of the solar selective-absorber of FIG. 1.

FIG. 7 is a schematic of a solar selective-absorber 700, which includes selective-absorber coating 720 on metal substrate 610 formed via interdiffusion of respective ions in metal substrate 610 and coating material 600, for example according to step 530 of method 500. Solar selective-absorber 700 and selective-absorber coating 720 are examples of solar selective-absorber 300 and selective-absorber coating 320, respectively, FIG. 3. Selective-absorber coating 720 includes a plurality of nanoparticles 726 in a polymer-matrix composite 724, which are respective examples of nanoparticle 326 and polymer-matrix composite 324. Each nanoparticle 726 is formed of a crystal lattice, which has a spinel unit cell 730.

As a result of interdiffusion between metal substrate 610 and coating material 600, ions from metal substrate 610 diffuse into original crystal lattice of unit cells 630 and replace ions of unit cell 630 with ions of metal substrate 610, resulting in unit cell 730. Like unit cell 630, unit cell 730 includes manganese, iron, oxygen. Unit cell 730 also includes at least one of chromium, carbon, phosphorus, nickel, silicon, and sulfur. The interdiffusion reaction changes the stoichiometry of unit cell 730, relative to unit cell 630, such that unit cell 730 has enhanced optical properties conducive for absorbing solar radiation and reduced infrared emissivity.

Nanoparticles 624 and 726 have diameters ranging from 10 nm to 60 nm, and may have a non-stoichiometric composition. Polymer-matrix composite 724 is formed of silicone. In an embodiment, host material 622 is a silicone polymer precursor. Solvents, such as Xylene or Xylene with isopropyl alcohol, may be used as the solvents to dilute host material 622 to tune the viscosity of host material 622.

Selective-absorber coating 720 may be formed by uniformly dispersing oxide nanoparticles in host material 622 followed by spray-coating or dip-coating metal substrate 610 and annealing the coated substrate at a service temperature exceeding 500° C. in air. Metal substrate 610 may by chemically etched to create desirable topological texture on the surface to enhance the interdiffusion and optical properties. The volume fraction and weight fraction of nanoparticles 726 in selective-absorber coating 720 is between 0.1 and ten percent. The thickness of coating 720 may be between one and fifty microns depending on concentration of nanoparticles 726. Higher concentrations of nanoparticles 726 enable a thinner coating to achieve the same absorption and emissivity properties. Upon interdiffusion between the solar selective-absorber coating 720 and metal substrate 610 at high temperatures, exceeding 700° C. for example, transition metal elements inside substrate 610, including Ni, Cr, Fe, Mn, etc., diffuse into the oxide nanoparticles so as to further optimize their stoichiometry and enhance their optical performance. The interdiffusion reaction eventually reaches a thermodynamic equilibrium, thereby achieving long-term thermodynamic stability at high temperatures.

In the following, three example selective-absorber coatings are disclosed, each of which is an example of selective-absorber coating 320. Nanoparticles of each of three example selective-absorber coatings include manganese. We experimentally determined that including manganese in the nanoparticles results in selective-absorber coatings with the best absorption and emissivity properties.

Example 1: $Mn_{1-x}Fe_{2+y}O_4$ Nanoparticle-Silicone Polymer Composite Solar Selective-Absorber Coatings In the first example, nanoparticles 224 include $MnFe_2O_4$ and non-stoichiometric $Mn_{1-x}Fe_{2+y}O_4$ nanoparticles each with the radius between five and thirty nanometers. For the non-stoichiometric compositions, $x > -0.3$ and $y < 0.3$. The nanoparticles have a cubic spinel crystal structure. The particles were dispersed into silicone precursors to achieve a weight fraction between three and nine percent, and then spray coated on stainless steel and Inconel Ni-based alloy substrates. The solar selective-absorber coating thickness is 15 to 50 micrometers.

Figure 8:
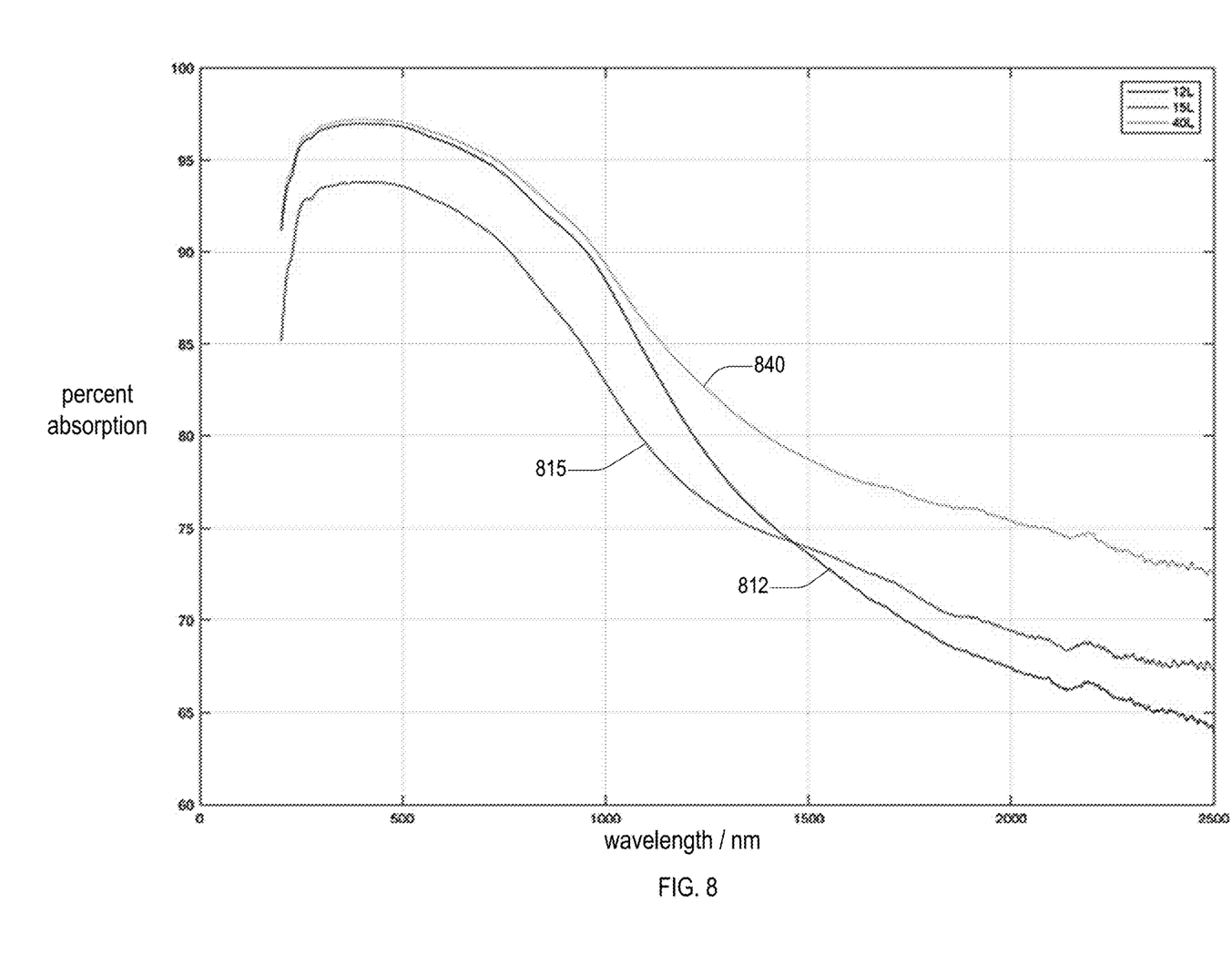
FIG. 8 is an absorption spectrum of an embodiment of the solar selective-absorber of FIG. 1.
Figure 9:
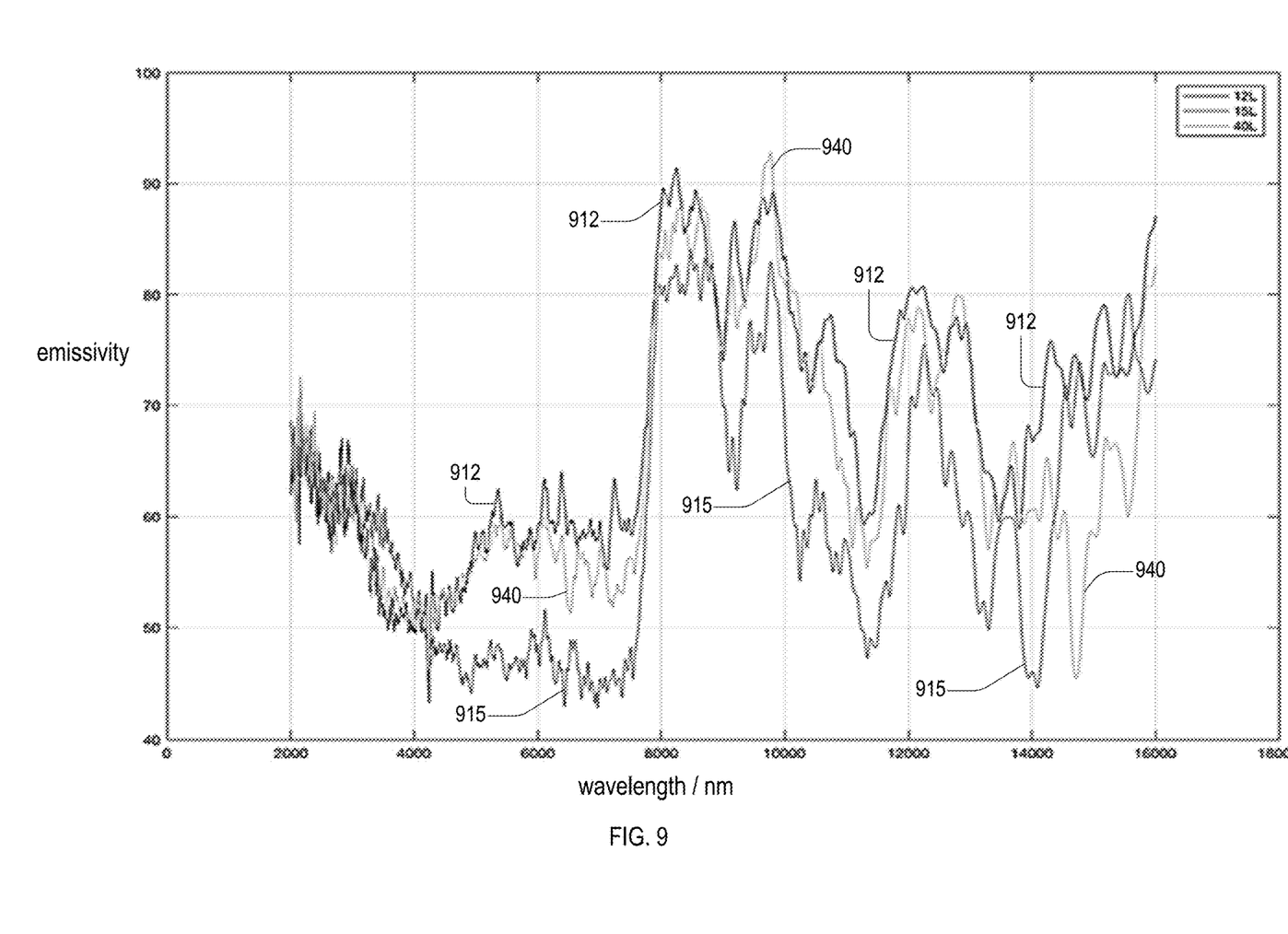
FIG. 9 is an emissivity spectrum of the solar selective-absorber of FIG. 8.

A UV/VIS/NIR spectrophotometer and Fourier Transform IR (FTIR) spectrometer were used to measure percent reflectance in the solar spectrum regime and the IR regime, respectively, before and after annealing in air at 750° C. for 500 hours. Absorptance and emissivity were calculated as one minus reflectivity, as transmittance equal zero. FIGS. 8 and 9 show, respectively, post-annealing optical responses in the solar spectrum regime and the IR regime a solar-selective-absorber on stainless steel (SS310) substrate. The solar-selective-absorber has a 1:9 precursor-to-solvent ratio, where the precursor is silicone and the solvent is Xylene. After air annealing at 750° C. for 500 hours, the $MnFe_2O_4$ had a three-percent weight fraction with respect to the matrix.

FIGS. 8 and 9 show optical properties of three samples of this first example solar selective-absorber in the solar spectrum regime and infrared spectrum region, respectively. The first sample has twelve layers, the second sample has fifteen layers, and the third sample has forty layers, where each layer is approximately 630 nm thick. FIG. 8 includes three spectra 812, 815, and 840, which correspond to the first, second, and third sample, respectively. FIG. 9 includes three spectra 912, 915, and 940, which correspond to the first, second, and third sample, respectively.

Prior to thermal air annealing in air at 750° C. for 500 hours, the maximum absorptance ranges from 93 percent to 95 percent and the maximum emissivity up to 95 percent. After annealing, the results demonstrate that absorptance can reach above 97 percent in the solar spectrum regime (FIG. 8) and the emissivity is reduced to 40 percent at infrared wavelengths (FIG. 9). Even though the samples involve transition-metal oxide nanoparticles, this embodiment has demonstrated that metal oxidation is not an issue as the samples were air-stable in extremely high temperatures up to 750° C. and 500 hours while maintaining or improving optical responses. The aforementioned interdiffusion with the substrate substantially improves the optical performance.

Example 2: $MnO_2$ Nanoparticle-Silicone Polymer Composite Solar Selective-Absorber Coatings In this example, the oxide nanoparticles are $MnO_2$ with radii ranging from three to thirty nanometers. As in Example 1, the particles were dispersed into silicone precursors to achieve a weight fraction between three and nine percent. The solar selective-absorber coating thickness is fifteen to fifty micrometers. For coatings in this thickness range, the solar absorption is increased while emittance decreased after interdiffusion at 750° C. for 500 hours compared to the as-coated samples prior to any sort of heat treatment. Again, interdiffusion overcomes the aforementioned efficiency droop.

Example 3: $Cu_yFe_xMn_{2-x}O_4$ Nanoparticle-Silicone Polymer Composite Solar Selective-Absorber Coatings In this example, the $Cu_yFe_xMn_{2-x}O_4$ nanoparticle has a spinel crystal structure and x ranges from 0.05 to 1.0 while y ranges from 0.5 to 1.5. The radius of the oxide nanoparticles ranges from three to thirty nanometers. The dispersion in silicone, the coating process, and the resultant weight fraction are similar to that of the previous two examples. In embodiments, the solar selective-absorber coating thickness is the range of fifteen to fifty micrometers. In embodiments, the thickness is between 90 micrometers and 110 micrometers.

Figure 10:
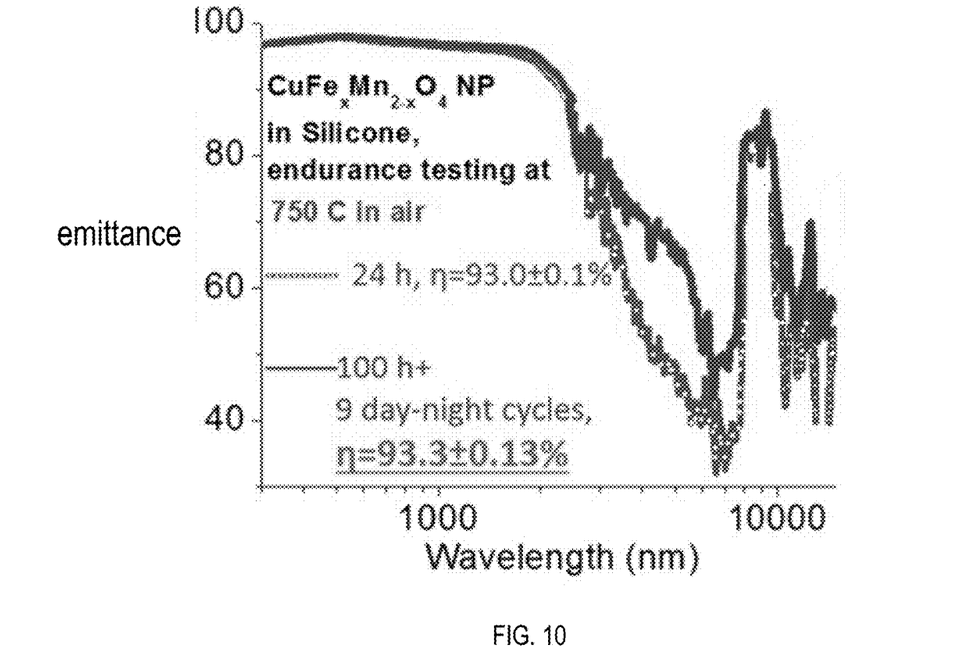
FIGS. 10 and 11 show, respectively, emittance and thermal efficiency of a spray-coated $CuFe_xMn_{2-x}O_4$ nanoparticle-silicone solar selective-absorber, in an embodiment.
Figure 11:
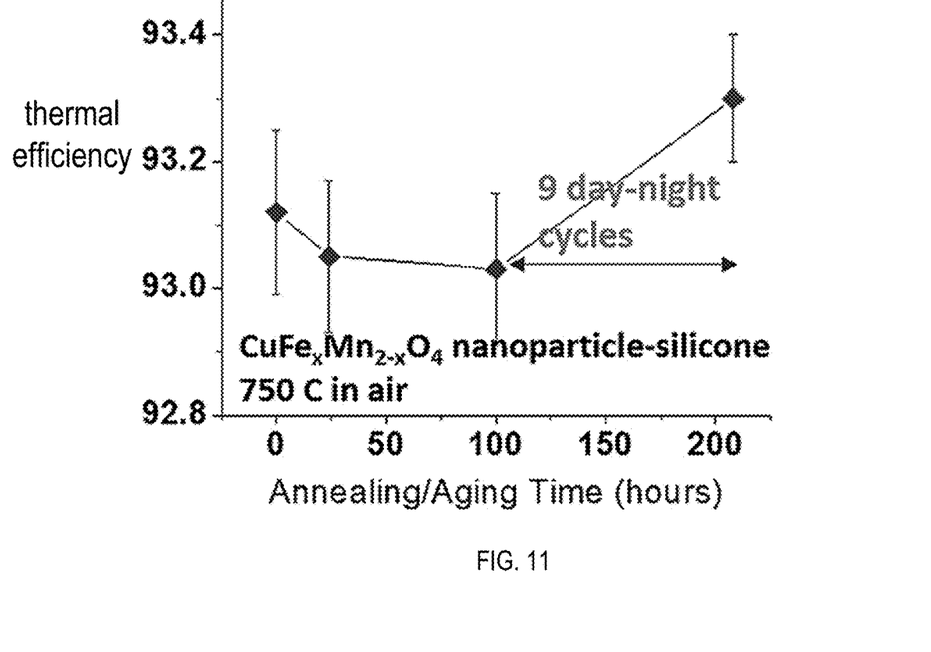
Figure 12:
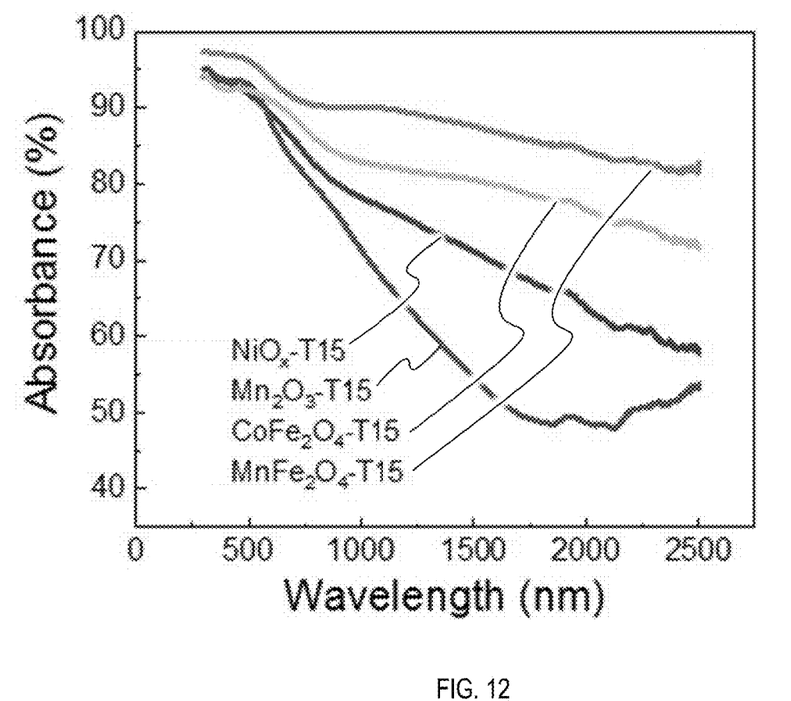
FIG. 12 is graphical comparison of solar absorbance spectra of four embodiments of the solar selective-absorber of FIG. 3.

FIGS. 10 and 11 show, respectively, emittance and optical-to-thermal energy conversion efficiency $\eta_{therm}$ of a spray-coated $CuFe_xMn_{2-x}O_4$ nanoparticle-silicone solar selective-absorber, where x≈0.5. A high $\eta_{therm}$ of 93.3 percent is achieved after 100 h annealing in air at 750° C. (not shown in FIG. 10), followed by nine day-night cycles between 750° C. (12 h) and 25° C. (12 h) (solid curve in FIG. 10). FIG. 11 shows that $\eta_{therm}$ begins to increase after one hundred hours at 750° C. as a result of the engineered interdiffusion between the coating and the Inconel substrate. Comparison of Solar-Selective Coatings with Different Nanoparticle Types As optical properties of nanoparticles in the pigmented coatings are extremely critical to the solar selective absorbance, four different nanoparticles, $MnFe_2O_4$, $NiO_x$, $Mn_2O_3$, and $CoFe_2O_4$, have been dispersed in T15 matrix and examined to determine which nanoparticles have the most promising optical performances. These nanoparticles were well-dispersed in T15 silicone fluid matrix on SS310 substrates with nanoparticle weight percentage equal to five. FIG. 12 is graphical comparison of solar absorbance spectra of different nanoparticle-T15 pigmented solar selective-absorber coatings with the stated nanoparticle weight percentage and 40 μm-thick films. Each of these coatings is an example of coating 320, FIG. 3. FIG. 12 demonstrates that absorbance of the $MnFe_2O_4$-T15 coating is highest. The $CuFe_2O_4$-T15 coating, while showing similar trend of absorbance as that of $MnFe_2O_4$-T15 coating, has lower absorbance by approximately ten percent. It can also be seen that $NiO_x$-T15 coating has a significantly lower absorbance, followed by $Mn_2O_3$-T15 coating, which demonstrates a very rapid roll-off.

Figure 13:
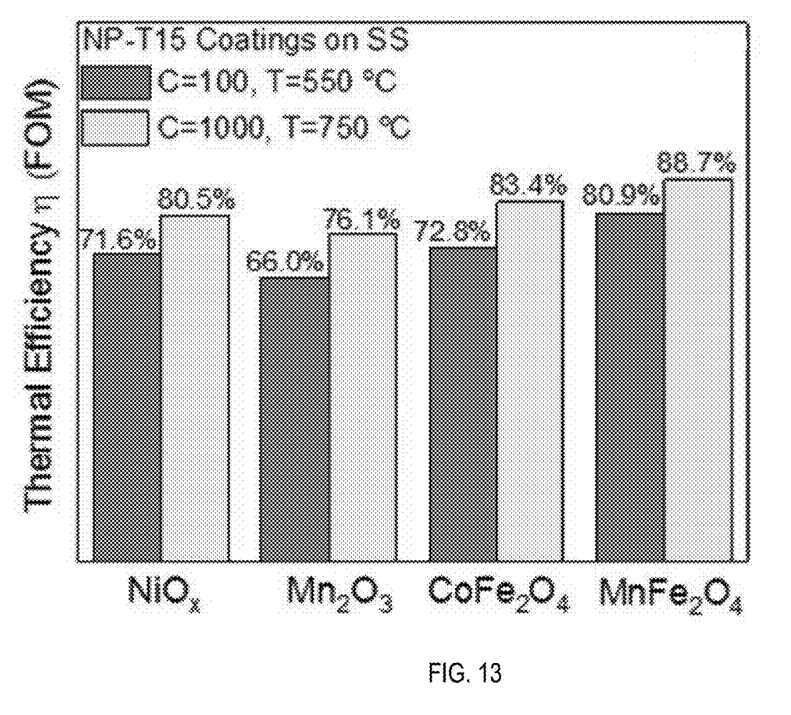
FIG. 13 is a graphical representation of the thermal efficiencies of the solar selective-absorbers of FIG. 12.

FIG. 13 is a graphical representation of the optical-to-thermal energy conversion efficiencies of the solar selective-absorber coatings of FIG. 12. Compared to $NiO_x$-T15, $Mn_2O_3$-T15, and $CuFe_2O_4$-T15 coatings, $MnFe_2O_4$-T15 coatings demonstrates the high optical-to-thermal energy conversion efficiencies for both cases of C=100, T=550° C. and C=1000, T=750° C., where C is the solar concentration ratio.

$MnFe_2O_4$ Nanoparticle-RSN Coatings on Stainless Steel $MnFe_2O_4$-RSN coatings were annealed in a box furnace in air for a thermal endurance test at 750° C. Two samples, S1 and S2, were coated with the same three-percent weight fraction of $MnFe_2O_4$ nanoparticles in an RSN matrix on SS310 at a thickness of twenty micrometers. Each of samples S1 and S2 is an example of substrate 310, FIGS. 1 and 3. S1 has a total annealing time of 500 hours and optical measurements were taken after 24 hours, 100 hours, 300 hours, and 500 hours. S2 was annealed at 750° C. for 700 hours directly and cooled down to room temperature.

Figure 14:
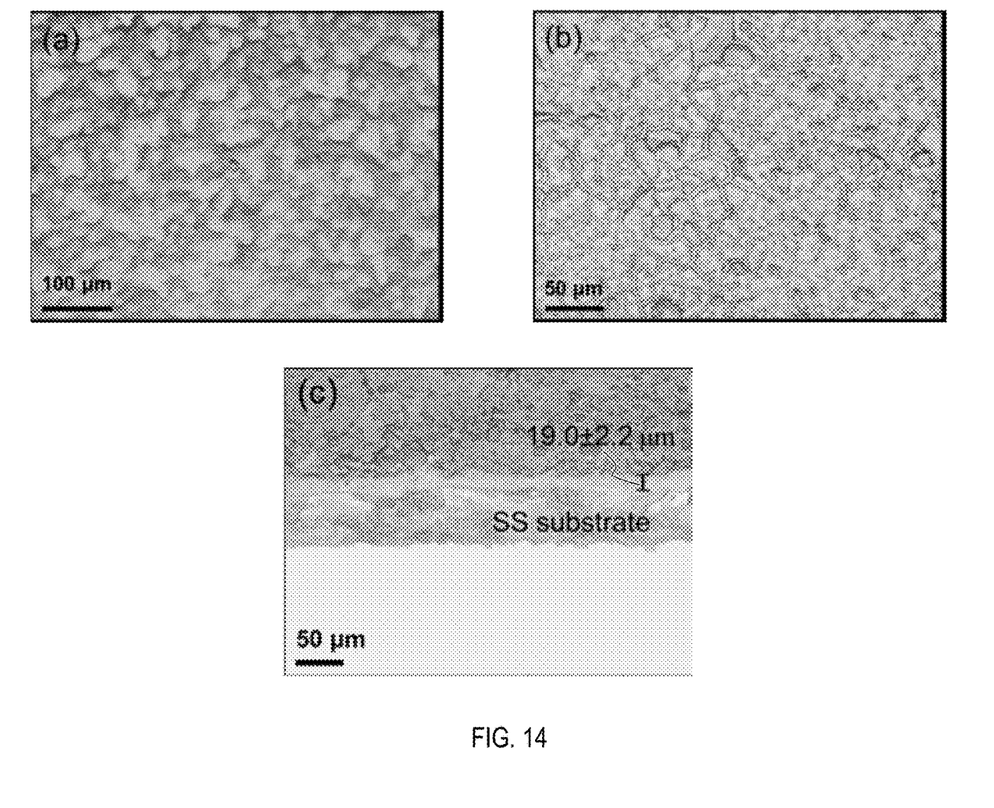
FIG. 14 shows SEM images of an embodiment of the solar selective-absorber of FIG. 1.

FIG. 14 includes SEM images of a three-percent weight fraction $MnFe_2O_4$-RSN coating on a SS310 substrate. FIG. 14(a) is an image of the as-coated sample without any annealing treatments. Many craters can be observed as a result of liquid flow due to surface tension gradients and/or evaporation of volatile organic solvents during spray coating. After annealing (at 750° C. for 500 hours), it can be seen from FIG. 14(b) that the films are homogenized due to the reflow of silicone upon annealing, and grain-like structures are formed on the coating surface. The observed microgrooves on the surface do not penetrate through the entire coating, which can be seen in the cross-sectional SEM image in FIG. 14(c), in which the substrate is tilted by fifteen degrees. The cross-sectional image also shows that the coating thickness is about twenty micrometers with a variation of approximately ±10 percent.

Figure 15:
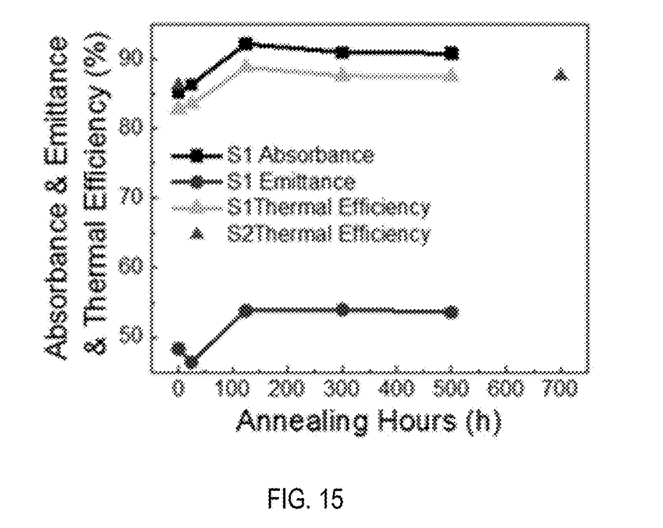
FIG. 15 shows the absorbance, emittance, and thermal efficiency as a function of annealing hours for the solar selective-absorber of FIG. 14.

FIG. 15 shows the absorbance, emittance, and optical-to-thermal energy conversion efficiency as a function of annealing hours for sample S1 and the optical-to-thermal energy conversion efficiency of sample S2 after 700 h annealing at 750° C. In the case of solar concentration ratio C=1000 and T=750° C., FIG. 15 demonstrates that the optical-to-thermal energy conversion efficiency increases up to 124 hours, then decreases slightly and stabilizes at 87.6 percent after longer annealing times as a result of improved solar absorbance. FIG. 15 also shows that the absorbance of sample S1 gradually increases from 85.4 percent and saturates at ~92 percent after annealing for 124 hours. The emittance of sample S1 demonstrates a similar trend from 48 percent to 54 percent.

Figure 16:
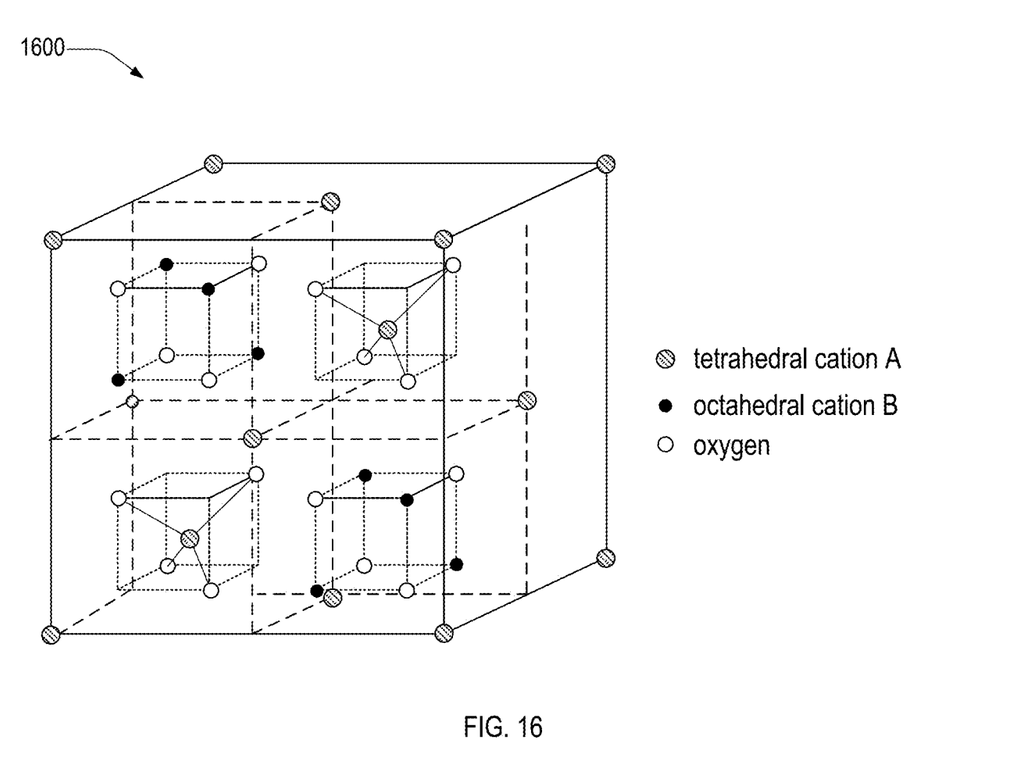
FIG. 16 is a schematic of a spinel unit cell of an oxide nanoparticle which is present in embodiments of the solar selective-absorber of FIG. 1.

FIG. 16 is a schematic of a unit cell 1600 of an oxide nanoparticle with a spinel structure $AB_2O_4$, where A and B are tetrahedrally and octahedrally coordinated cations, respectively, and oxygen O is an anion. Nanoparticle $AB_2O_4$ is an example of a transition metal nanoparticle 224 or 326. When spinel unit cell 1600 includes copper, each of tetrahedrally coordinated cations A is a copper ion. When spinel unit cell 1600 includes manganese, at least one of octahedrally coordinated cations B is a manganese ion. When spinel unit cell 1600 includes iron, at least one of octahedrally coordinated cations B is an iron ion. In embodiments, spinel unit cell 1600 includes both iron and manganese. In embodiments, spinel unit cell 1600 includes manganese, copper, and iron.

Changes may be made in the above methods and systems without departing from the scope hereof. It should thus be noted that the matter contained in the above description or shown in the accompanying drawings should be interpreted as illustrative and not in a limiting sense. Herein, and unless otherwise indicated, the phrase "in embodiments" is equivalent to the phrase "in certain embodiments," and does not refer to all embodiments. The following claims are intended to cover all generic and specific features described herein, as well as all statements of the scope of the present method and system, which, as a matter of language, might be said to fall therebetween.

What is claimed is:

1. A selectively-absorbing material comprising:
a silicone polymer; and
a plurality of transition-metal oxide nanoparticles dispersed within the silicone polymer, each of the plurality of transition-metal oxide nanoparticles including manganese, copper, and a non-stoichiometric proportion of chromium.

2. The selectively-absorbing material of claim 1, the silicone polymer having a kinematic viscosity between 0.5 and 500 square-millimeters per second.

3. The selectively-absorbing material of claim 1, a diameter of each of the plurality of transition-metal oxide nanoparticles being between six and sixty nanometers.

4. The selectively-absorbing material of claim 1, a volume fraction of the plurality of transition-metal oxide nanoparticles being between 0.1 and ten percent.

5. The selectively-absorbing material of claim 1, a weight fraction of the plurality of transition-metal oxide nanoparticles being between 0.1 percent and ten percent.

6. The selectively-absorbing material of claim 1, further comprising a plurality of non-stoichiometric $Mn_{1-x}Fe_{2+y}O_4$ nanoparticles dispersed within the silicone polymer, wherein $-0.3<x<0.3$ and $-0.3<y<0.3$, wherein each of the non-stoichiometric $Mn_{1-x}Fe_{2+y}O_4$ nanoparticles does not include zinc.

7. The selectively-absorbing material of claim 1, the plurality of transition-metal oxide nanoparticles including a plurality of $Cu_yCr_xMn_{2-x}O_4$ nanoparticles, wherein $0.05 \leq x < 1.0$ and $0.5 \leq y \leq 1.5$.

8. A solar receiver comprising:
a metal substrate including an etched surface having a root-mean-square microroughness between 0.05 micrometers and two micrometers;
a polymer matrix disposed on the etched surface; and
a plurality of transition-metal oxide nanoparticles dispersed within the polymer matrix, each of the plurality of transition-metal oxide nanoparticles including manganese, copper, and a non-stoichiometric proportion of chromium.

9. The solar receiver according to claim 8, the metal substrate including a transition metal.

10. The solar receiver of claim 8, a thickness of the polymer matrix being between one and fifty micrometers.

11. A method of producing a plurality of transition-metal oxide nanoparticles comprising:
recrystallizing a plurality of nanoparticles at a temperature between 30° and 700° C., each of the plurality of nanoparticles including manganese, copper, and a non-stoichiometric proportion of chromium.

12. The method of claim 11, further comprising synthesizing the plurality of nanoparticles.

13. A method for forming a polymer-matrix composite comprising:
producing a plurality of transition-metal oxide nanoparticles according to the method of claim 11; and
forming a polymer matrix from a silicone polymer having a kinematic viscosity between 0.5 and 500 square-millimeters per second.

14. The method of claim 13, further comprising dispersing the plurality of transition-metal oxide nanoparticles in the polymer matrix to yield the polymer-matrix composite.

15. A method for forming a polymer-matrix composite comprising:
producing a plurality of transition-metal oxide nanoparticles according to the method of claim 11; and
dispersing the plurality of transition-metal oxide nanoparticles in a polymer matrix to yield the polymer-matrix composite.

16. A method for fabricating a selective-absorber, comprising:
etching a top surface of a metal substrate;
depositing a polymer-matrix composite on the etched top surface, the polymer-matrix composite including a plurality of transition-metal oxide nanoparticles dispersed therein, each of the plurality of transition-metal oxide nanoparticles including manganese, copper, and a non-stoichiometric proportion of chromium; and
interdiffusing the polymer-matrix composite and the metal substrate.

17. The method of claim 16, the step of interdiffusing including annealing the polymer-matrix composite for at least twenty-four hours at a service temperature exceeding 500° C.

18. The method of claim 16, the step of etching comprising etching the metal substrate with a solution that includes hydrogen chloride and hydrogen peroxide.

19. The solar receiver of claim 8, each of the plurality of transition-metal oxide nanoparticles including a non-stoichiometric proportion of at least two of manganese, copper, and chromium.

20. The selectively-absorbing material of claim 1, each of the plurality of transition-metal oxide nanoparticles including a non-stoichiometric proportion of at least two of manganese, copper, and chromium.

* * * * *